United States Patent [19]

Takano

[11] Patent Number: 5,701,087
[45] Date of Patent: Dec. 23, 1997

[54] PRESCALER IC TEST METHOD CAPABLE OF EXECUTING ALTERNATE CURRENT TEST BY THE USE OF IC TESTER FOR DIRECT CURRENT TEST

[75] Inventor: Isamu Takano, Tokyo, Japan

[73] Assignee: NEC Corporation, Tokyo, Japan

[21] Appl. No.: 520,783

[22] Filed: Aug. 30, 1995

[30] Foreign Application Priority Data

Sep. 2, 1994 [JP] Japan ................................ 6-209808

[51] Int. Cl.$^6$ ...................................................... G01R 31/26
[52] U.S. Cl. ............................................................ 324/765
[58] Field of Search ................................... 324/765–769, 324/763; 368/108; 371/22.3, 22.4, 22.6

[56] References Cited

U.S. PATENT DOCUMENTS 4,547,724  10/1985  Beazley et al. ........................ 324/626
5,202,626   4/1993  Pham et al. .

FOREIGN PATENT DOCUMENTS 62-170859  7/1987  Japan .

*Primary Examiner*—Vinh P. Nguyen
*Assistant Examiner*—Russel M. Kobert
*Attorney, Agent, or Firm*—Whitham, Curtis, Whitham & McGinn

[57] ABSTRACT

In a prescaler IC test method for carrying out a characterization test to decide whether or not a prescaler IC is normal by the use of an IC tester for carrying out a predetermined decision operation and a probe card for mounting the prescaler IC kept on a wafer, the prescaler IC carries out a frequency dividing operation on reception of a frequency signal to produce a frequency divided signal. The characterization test comprises the steps of generating the frequency signal to supply the frequency signal to the prescaler IC on reception of a direct current control signal, converting the frequency divided signal into a converted signal having a predetermined signal width and a signal level, detecting a first mean value of the signal level, and supplying the first mean value to the IC tester in the form of a direct current signal. The IC tester is supplied with the first mean value and carries out the predetermined decision operation by the use of the first mean value.

7 Claims, 3 Drawing Sheets

PRESCALER IC TEST METHOD CAPABLE OF EXECUTING ALTERNATE CURRENT TEST BY THE USE OF IC TESTER FOR DIRECT CURRENT TEST

BACKGROUND OF THE INVENTION

This invention relates to a prescaler IC (Integrated Circuit) test method for testing a prescaler IC on a wafer check process in a manufacturing process of the prescaler IC. Such a prescaler IC test method is particularly useful for the prescaler IC which belongs to a high speed and large scale IC.

As is well known in the art, the prescaler IC is generally used as a frequency divider in a phase lock loop system included in a receiving unit of a mobile communication set. Such a prescaler IC is manufactured through a diffusion process, a wafer check process, an assembly process, a sorting or screening process, and an inspection process in that order. In particular, the wafer check process is applied to the prescaler IC kept on a wafer. Such a prescaler IC kept on the wafer is, so to speak, an intermediate product. In the wafer check process, a characterization check of the prescaler IC is carried out by the use of a probe card which is for mounting the prescaler IC kept on the wafer as well known in the art. The characterization check is generally carried out by a direct current test. However, it is hard to find out all defects of the prescaler IC by the direct current test only. For this reason, the characterization check should be carried out by an alternating current test in addition to the direct current test.

Hitherto, the direct current test and the alternating current test are individually carried out by the use of different test devices. Namely, the direct current test is carried out, at first, by the use of a direct current tester and then the alternating current test is carried out by the use of an alternating current tester. This means that it requires increased cost for the direct current tester and the alternating current tester.

SUMMARY OF THE INVENTION

It is therefore an object of this invention to provide a prescaler IC test method which is capable of executing an alternating current test by the use of an IC tester for a direct current test.

It is another object of this invention to provide the prescaler IC test method which can precisely decide whether or not a prescaler IC is normal.

It is a further object of this invention to provide the prescaler IC test method which can lower production costs.

Other objects of this invention will become clear as the description proceeds.

On describing the gist of this invention, it is possible to understand that a prescaler IC test method is used to carry out a characterization test to decide whether or not a prescaler IC is normal by the use of an IC tester for carrying out a predetermined decision operation and a probe card for mounting the prescaler IC kept on a wafer. The prescaler IC carries out a frequency dividing operation on reception of a frequency signal to produce a frequency divided signal. The IC tester supplies a direct current control signal to the probe card on the start of the characterization test. The probe card delivers a test result to the IC tester as a result of the characterization test.

According to an aspect of this invention, the characterization test comprises the steps of generating the frequency signal to supply the frequency signal to the prescaler IC on reception of the direct current control signal. As a result, the prescaler IC produces the frequency divided signal. The characterization test further comprises the steps of converting the frequency divided signal into a converted signal having a predetermined signal width and a signal level, detecting a first mean value of the signal level of the converted signal, and supplying the first mean value to the IC tester in the form of a direct current signal. The IC tester is supplied with the first mean value and carries out the predetermined decision operation by the use of the first mean value.

DESCRIPTION OF THE PREFERRED EMBODIMENT

Figure 1:
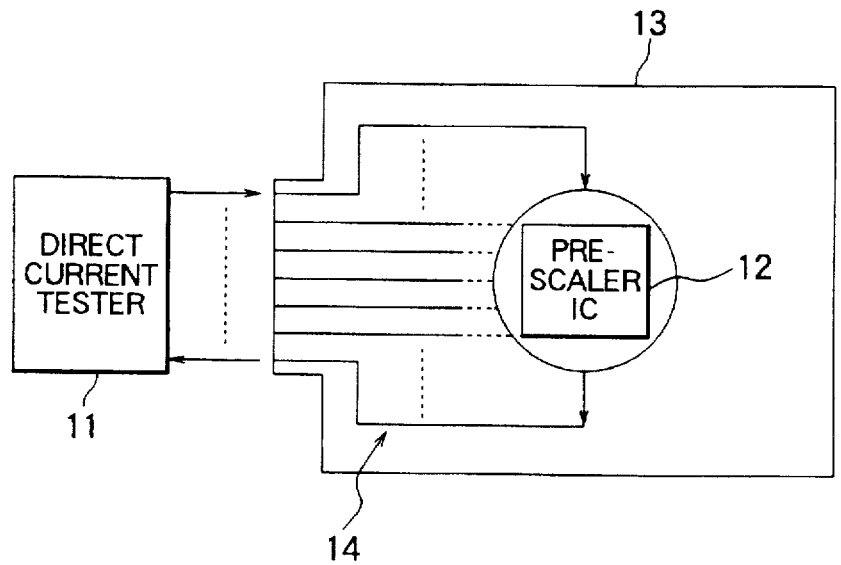
FIG. 1 is an illustration for use in describing a conventional direct current test.
Figure 2:
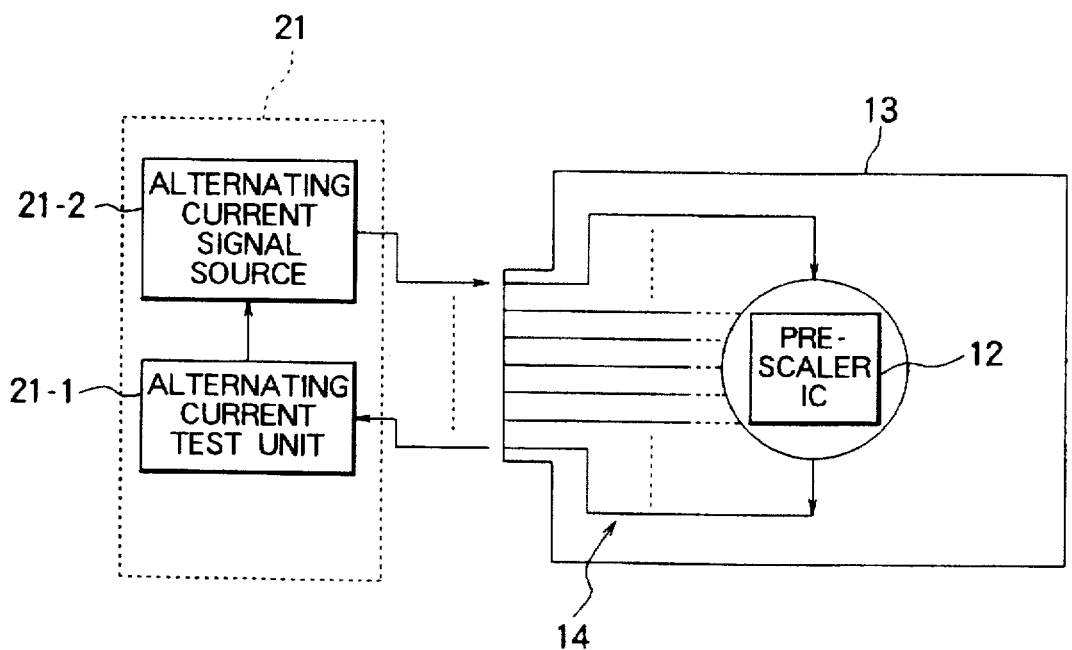
FIG. 2 is an illustration for use in describing a conventional alternating current test.

Referring to FIGS. 1 and 2, a conventional direct current test and a conventional alternating current test will be described at first in order to facilitate an understanding of the present invention.

In FIG. 1, the direct current test is carried out by the use of a direct current tester 11. A prescaler IC 12 is an intermediate product and is mounted on a probe card 13 in a state kept on a wafer. In other words, the prescaler IC 12 is provided such that it is formed on the wafer. A plurality of wiring patterns 14 are formed on the probe card 13 in order to electrically connect the direct current tester 11 and the prescaler IC 12. Strictly, one end of the wiring patterns 14 are connected to the direct current tester 11 via a connector (not shown) while the other end of the wiring patterns 14 are connected to the prescaler IC 12 via probe needles (not shown). The probe needles are disclosed in Japanese Unexamined Patent Publication No. 170859/1987 (Tokkai Sho 62-170859).

As is well known in the art, the direct current tester 11 carries out a direct current test in accordance with a direct current test program which is memorized in a memory unit (not shown) included in the direct current tester 11. On start of the direct current test, the direct current tester 11 delivers a direct current voltage signal or a direct current signal to the prescaler IC 12 as a control signal through one of the wiring patterns 14. Supplied with the control signal, the prescaler IC 12 produces an output direct current voltage signal. The output direct current voltage signal is supplied to the direct current tester 11 through another one of the wiring patterns 14. In accordance with a predetermined criterion, the direct current tester 11 decides whether or not the prescaler IC 12 is normal by the use of the output direct current voltage signal. The above-mentioned operation is repeated for all of the remaining wiring patterns 14. It should be noted here that the direct current tester 11 produces the direct current voltage signal and receives the output direct current voltage signal in the form of the direct current voltage signal.

In FIG. 2, the alternating current test is carried out by the use of an alternating current tester 21 which comprises an alternating current test unit 21-1 and an alternating current signal source 21-2. In the same manner described in conjunction with FIG. 1, the alternating current tester 21 is connected to one end of the wiring patterns 14 while the prescaler IC 12 is connected to the other end of the wiring patterns 14.

As is well known in the art, the alternating current test unit 21-1 carries out the alternating current test in accordance with an alternating current test program which is memorized in a memory unit (not shown) included in the alternating current test unit 21-1. On the start of the alternating current test, the alternating current test unit 21-1 delivers a control signal to the alternating current signal source 21-2. On reception of the control signal, the alternating current signal source 21-2 generates an alternating current voltage signal and supplies the alternating current voltage signal to the prescaler IC 12 through one of the wiring patterns 14. Supplied with the alternating current voltage signal, the prescaler IC 12 produces an output alternating voltage signal. The output alternating voltage signal is supplied to the alternating current test unit 21-1 through one of the other wiring patterns 14. In accordance with a preselected criterion, the alternating current test unit 21-1 decides whether or not the prescaler IC 12 is normal by the use of the output alternating voltage signal. The above-mentioned operation is repeated for all of the remaining wiring patterns 14. It should be noted here that the alternating current tester 21 produces the alternating current voltage signal and receives the output alternating voltage signal in the form of the alternating current voltage signal.

As mentioned above, the alternating current tester 21 can only be used for the alternating current test in order to carry out the alternating current test. This means that the wafer test process requires increased cost for carrying out direct current test and the alternating current test.

Figure 3:
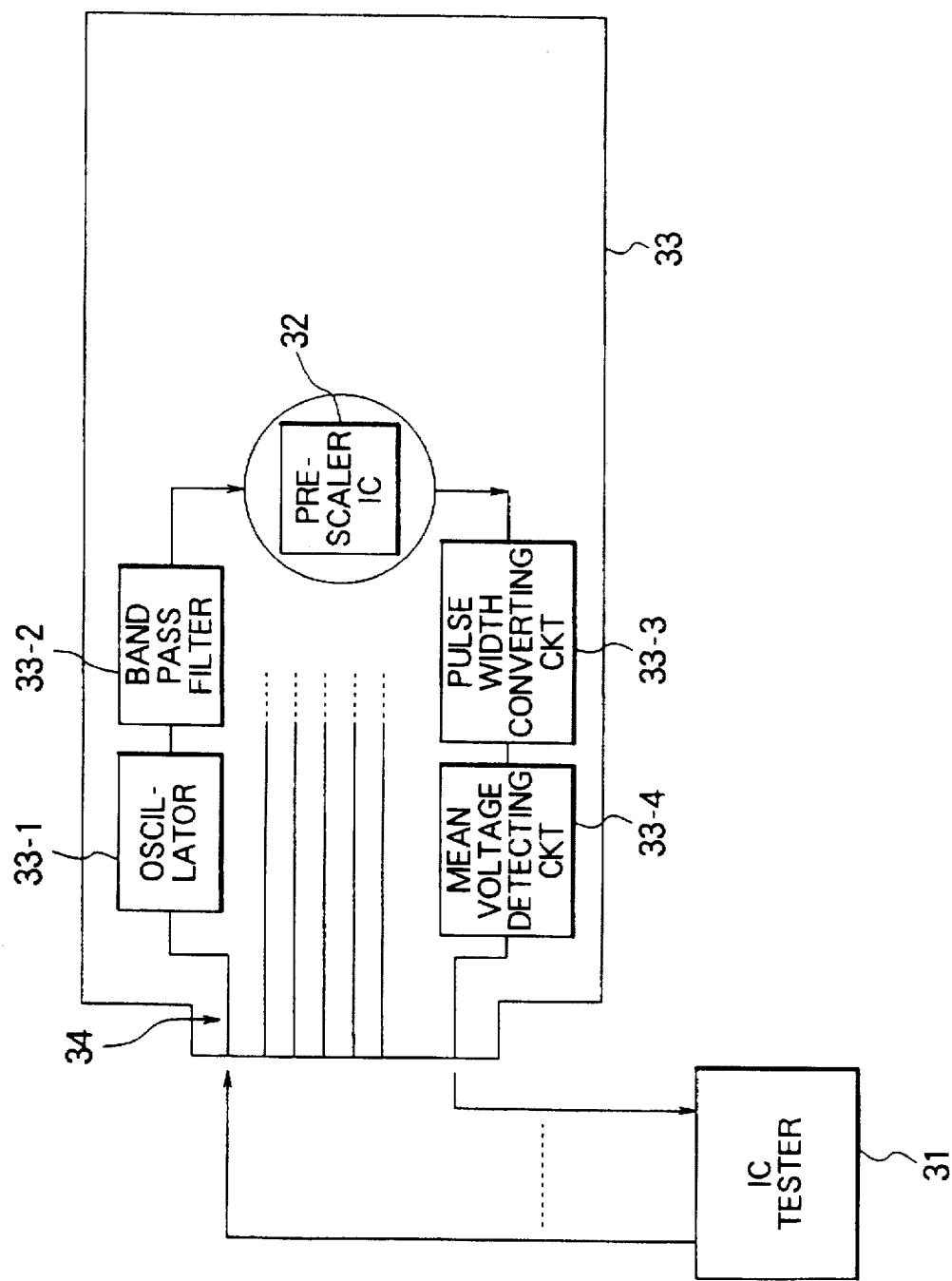
FIG. 3 is an illustration for use in describing a prescaler IC test method according to a preferred embodiment of this invention.
Figure 4A:
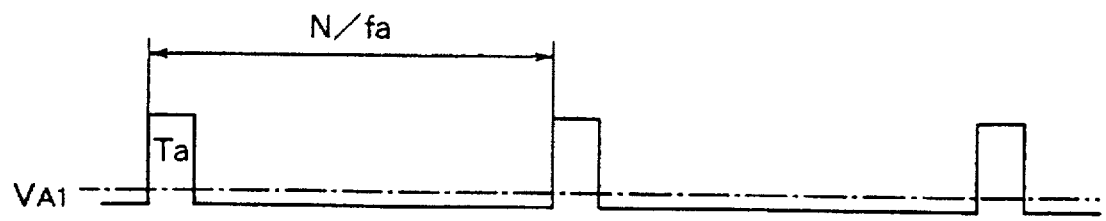
FIGS. 4A and 4B shows wave forms for use in describing an alternating current test of this invention.
Figure 4B:
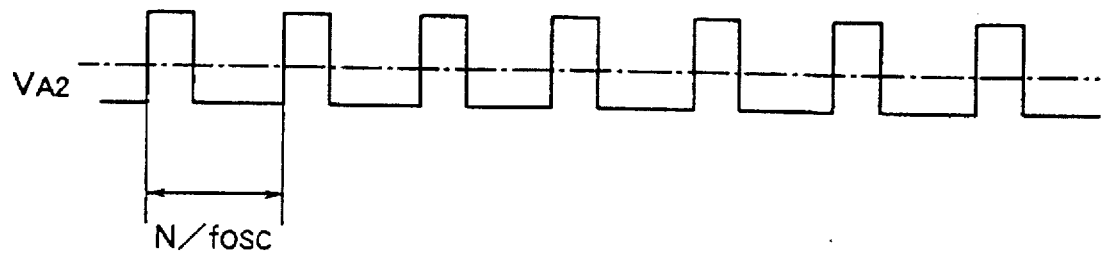
Figure 5:
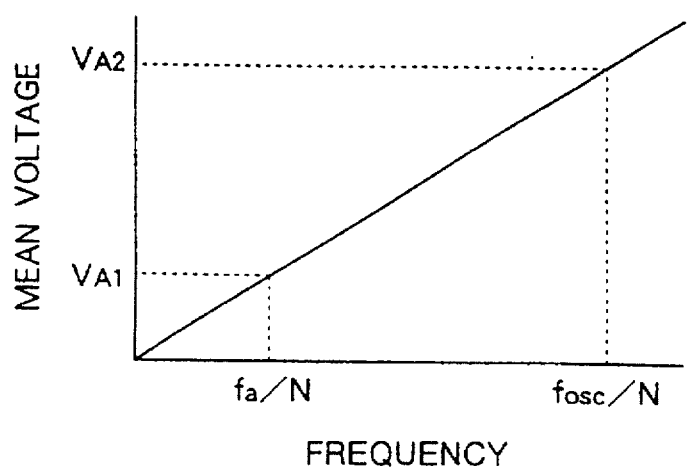
FIG. 5 shows a frequency versus mean voltage characteristic for use in describing a decision operation of this invention.

Referring to FIGS. 3 to 5, the description will be made as regards a prescaler IC test device for use in a prescaler IC test method according to this invention.

In FIG. 3, the prescaler IC test device comprises an IC tester 31 and a probe card 33 which is for mounting a prescaler IC 32 kept on a wafer. The prescaler IC 32 is generally used as a frequency divider having a predetermined frequency dividing ratio 1/N where N represents a positive integer greater than unity. The probe card 33 comprises an oscillator 33-1, a band-pass filter 33-2 having a predetermined frequency pass band, a pulse width converting circuit 33-3, and a mean voltage detecting circuit 33-4. A plurality of wiring patterns 34 are formed on the probe card 33. One end of the wiring patterns 34 are connected to the IC tester 31 via a connector (not shown). The other end of the wiring patterns 34 are connected to the prescaler IC 32 in the manner, such as probe needles, mentioned in conjunction with FIG. 1. The oscillator 33-1 and the band-pass filter 33-2 are connected between the IC tester 31 and an input side of the prescaler IC 32 by the use of one of the wiring patterns 34. The pulse width converting circuit 33-3 and the mean voltage detecting circuit 33-4 are connected between an output side of the prescaler IC 32 and the IC tester 31 by the use of another one of the wiring patterns 34.

The IC tester 31 carries out an alternating current test in accordance with a predetermined test program memorized in a memory unit (not shown) included therein. On the start of the alternating current test, the IC tester 31 supplies a direct current voltage signal, as a control signal, to the oscillator 33-1. As will later be described, the IC tester 31 decides whether or not the prescaler IC 32 is normal, by the use of an output signal of the mean voltage detecting circuit 33-4. Although the IC tester 31 is used for carrying out the alternating current test, the IC tester 31 is also used as the direct current tester mentioned in conjunction with FIG. 1 for the reason which will be described later.

The oscillator 33-1 is for generating a sine wave signal, as a frequency signal, having a predetermined frequency $f_a$ in response to the control signal. It is desirable that the predetermined frequency $f_a$ is sufficiently lower than 1/N of a free-running oscillation frequency $f_{osc}$ of the prescaler IC 32. Such an oscillator 33-1 can be implemented by an astable multivibrator. The prescaler IC 32 may be called a sine wave generating unit and carries out a frequency dividing operation when it is supplied with the frequency signal from the oscillator 33-1. The prescaler IC 32 delivers a frequency divided pulse signal having a divided frequency defined by $f_a/N$. On stopping of the frequency signal, the prescaler IC 32 carries out a free-running oscillation operation and delivers a free-running oscillation pulse signal having a frequency defined by $f_{osc}/N$.

As will later be described, the pulse width converting circuit 33-3 is for converting a pulse width of the frequency divided pulse signal and the free-running oscillation pulse signal into a predetermined pulse width Ta and produces a converted signal having a predetermined pulse width Ta and a signal level. Such a pulse width converting circuit 33-3 can be implemented by a monostable multivibrator known in the art. The pulse width converting circuit 33-3 may be called a signal width converting unit. It is desirable that the predetermined pulse width Ta be shorter than one-half of a pulse period of the frequency $f_{osc}/N$. The mean voltage detecting circuit 33-4 is for detecting a mean voltage of the signal level of the converted signal delivered from the pulse width converting circuit 33-3. The mean voltage detecting circuit 33-4 supplies a mean voltage signal representative of the mean voltage to the IC rester 31. Supplied with the mean voltage signal, the IC tester 31 decides whether or not the prescaler IC 32 is normal in accordance with the predetermined test program.

The description will be made as regards the alternating current test according to the prescaler IC test method. It will be assumed that the prescaler IC 32 has the predetermined frequency dividing ratio 1/N which is equal to 1/10 and has the free-running oscillation frequency $f_{osc}$ which is equal to 2 (GHz).

When the alternating current test is started, the IC tester 31 delivers the control signal to the oscillator 33-1. Supplied with the control signal, the oscillator 33-1 generates the frequency signal having the predetermined frequency $f_a$ which is equal to 20 (MHz). The frequency signal is supplied to the prescaler IC 32 through the band pass filter 33-2. Supplied with the frequency signal, the prescaler IC 32 produces the frequency divided pulse signal having the divided frequency 2 (MHz), if the prescaler IC 32 is a normal state. This is because the predetermined frequency dividing ratio 1/N is equal to 1/10. The frequency divided pulse signal is supplied to the pulse width converting circuit 33-3.

The pulse width converting circuit 33-3 detects, for example, a leading edge of each of the pulses in the frequency divided pulse signal and converts the pulse width of each of the pulses into the predetermined pulse width Ta. As illustrated in FIG. 4(a), the pulse width converting circuit 33-3 produces the converted signal comprising converted pulses each of which has the predetermined pulse width Ta substantially equal to 200 (pico-sec) for the reason mentioned above and each of which has the same signal level. It should be noted here that the pulse period of the converted signal is equal to $N/f_a$ that is the pulse period of the frequency divided pulse signal delivered from the prescaler IC 32.

Supplied with the converted signal, the mean voltage detecting circuit 33-4 detects a first mean voltage of the converted signal and delivers the mean voltage signal representative of the first mean voltage to the IC tester 31. The first mean voltage is depicted in FIG. 4(a) at $V_{A1}$.

Next, the IC tester 31 stops supply of the control signal. As a result, the oscillator 33-1 stops generation of the frequency signal. When the prescaler IC 32 has no input signal, namely, the frequency signal, the prescaler IC 32 starts a free-running oscillation operation and delivers the free-running oscillation pulse signal having the free-running oscillation frequency $f_{osc}/N$ to the pulse width converting circuit 33-3. In the same manner mentioned in conjunction with FIG. 3(a), the pulse width converting circuit 33-3 converts the pulse width of each of the pulses into the predetermined pulse width Ta. The pulse period of the converted signal is equal to $N/f_{osc}$ as illustrated in FIG. 4(b).

The pulse width converting circuit 33-3 produces the converted signal comprising the converted pulses each of which has the predetermined pulse width Ta and the same signal level. Supplied with the converted signal, the mean voltage detecting circuit 33-4 detects a second mean voltage of the converted signal and delivers the mean voltage signal representative of the second mean voltage to the IC tester 31. The second mean voltage is depicted in FIG. 4(b) at $V_{A2}$.

As illustrated in FIG. 5, if the prescaler IC 32 is the normal state in the alternating current test, the first mean voltage $V_{A1}$ corresponds to the divided frequency $f_a/N$. On the other hand, the second mean voltage $V_{A2}$ corresponds to the free-running oscillation frequency $f_{osc}/N$.

The IC tester 31 has first and second standard ranges which are memorized in the memory unit. The first standard range is for deciding whether or not the prescaler IC 32 is normal in the alternating current test. The second standard range is for deciding whether or not the prescaler IC 32 is normal in the alternating current test.

In the alternating current test, the IC tester 31 decides whether or not the first mean voltage $V_{A1}$ is present within the first standard range. When the first mean voltage $V_{A1}$ is present within the first standard range, the IC tester 31 decides that the prescaler IC 32 is the normal. Otherwise, the IC tester 31 decides that the prescaler IC 32 is abnormal. Similarly, the IC tester 31 decides whether or not the second mean voltage $V_{A2}$ is present within the second standard range. When the second mean voltage $V_{A2}$ is present within the second standard range, the IC tester 31 decides that the prescaler IC 32 is the normal. Otherwise, the IC tester 31 decides that the prescaler IC 32 is the abnormal.

It should be noted here that the IC tester 31 produces the control signal and receives the mean voltage signal in the form of the direct current voltage signal. This is the reason why the IC tester 31 is implemented by the direct current tester mentioned in conjunction with FIG. 1. In other words, in the present invention, the alternating current test can be performed by the IC tester for the direct current test. Of course, the IC tester 31 can be used for the direct current test also. In the example, the IC tester 31 carries out the alternating current test by the use of the first and the second mean voltages $V_{A1}$ and $V_{A2}$ in order to precisely decide whether or not the prescaler IC is the normal. However, the alternating current test may be carried out by the use of at least one of the first and the second mean voltages $V_{A1}$ and $V_{A2}$.

What is claimed is:

1. A prescaler IC test method for testing a prescaler IC with an IC tester and a probe card for performing a frequency dividing operation on reception of a frequency signal from said IC tester and producing a frequency divided signal, said IC tester supplying a direct current control signal to said probe card on a start of said test, said probe card delivering a test result to said IC tester as a result of said test, said test comprising the steps of:

generating, by said IC tester, said frequency signal;

supplying, by said probe card, said frequency signal to said prescaler IC on reception of said direct current control signal, said prescaler IC producing said frequency divided signal;

converting, by said probe card, said frequency divided signal into a test signal having a signal width and a signal level;

detecting by said probe card, a first mean value of the signal level of said test signal; and supplying by said probe card, said first mean value to said IC tester in the form of a direct current signal for allowing said IC tester to carry out said test.

2. A prescaler IC test method as claimed in claim 1, wherein said IC tester has a first standard range, said testing operation for determining whether said first mean value is within said first standard range, said IC tester determining that said prescaler IC represents a normal prescaler IC when said first mean value is within said first standard range.

3. A prescaler IC test method as claimed in claim 1, wherein said probe card comprises:

a sine wave generating circuit for generating said frequency signal in response to said direct current control signal to supply said frequency signal to said prescaler IC;

a signal width converting circuit connected to said prescaler IC for converting said frequency divided signal into said test signal having said predetermined signal width and said signal level; and a mean value detecting circuit connected to said signal width converting circuit for detecting said first mean value of the signal level of said test signal to supply said first mean value to said IC tester in the form of said direct current signal.

4. A prescaler IC test method as claimed in claim 3, wherein said sine wave generating circuit is implemented by an astable multivibrator.

5. A prescaler IC test method as claimed in claim 3, wherein said signal width converting circuit is implemented by a monostable multivibrator.

6. A prescaler IC test method as claimed in claim 1, wherein said prescaler IC generates a free-running oscillation frequency signal on stopping said frequency signal, said test further comprising the steps of:

stopping said frequency signal on stopping of said direct current control signal, said prescaler IC generating said free-running oscillation frequency signal;

converting said free-running oscillation frequency signal into a converted free-running oscillation frequency signal having said predetermined signal width and a free-running oscillation signal level;

detecting a second mean value of the free-running oscillation signal level of said converted free-running oscillation frequency signal; and supplying said second mean value to said IC tester in the form of said direct current signal;

said IC tester being supplied with said second mean value and carrying out said test by the use of said second mean value.

7. A prescaler IC test method as claimed in claim 6, wherein said IC tester has first and second standard ranges, said test being for deciding whether or not said first mean value is present within said first standard range and for deciding whether or not said second mean value is present within said second standard range, said IC tester deciding that said prescaler IC is normal when said first and said second mean values are present within said first and said second standard ranges, respectively.

* * * * *